US011855125B2

(12) United States Patent
Pietambaram et al.

(10) Patent No.: US 11,855,125 B2
(45) Date of Patent: Dec. 26, 2023

(54) CAPACITORS WITH NANOISLANDS ON CONDUCTIVE PLATES

(71) Applicant: Intel Corporation, Santa Clara, CA (US)

(72) Inventors: Srinivas Pietambaram, Chandler, AZ (US); Brandon C. Marin, Chandler, AZ (US); Jeremy Ecton, Gilbert, AZ (US); Hiroki Tanaka, Chandler, AZ (US); Frank Truong, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 926 days.

(21) Appl. No.: 16/560,647

(22) Filed: Sep. 4, 2019

(65) Prior Publication Data

US 2021/0066447 A1    Mar. 4, 2021

(51) Int. Cl.
*H01L 21/48* (2006.01)
*H01G 4/008* (2006.01)
*H01G 4/28* (2006.01)
*H01G 4/12* (2006.01)
*H01L 49/02* (2006.01)

(52) U.S. Cl.
CPC ............. *H01L 28/60* (2013.01); *H01G 4/008* (2013.01); *H01G 4/1209* (2013.01); *H01G 4/28* (2013.01); *H01L 21/4846* (2013.01)

(58) Field of Classification Search
CPC ..... H01L 28/60; H01L 21/4846; H01G 4/008; H01G 4/1209; H01G 4/28
USPC .......................................................... 257/301
See application file for complete search history.

(56) References Cited

U.S. PATENT DOCUMENTS

| 6,281,535 | B1* | 8/2001 | Ma | ..................... H01L 21/76838 257/E21.018 |
| 6,713,363 | B1* | 3/2004 | Lee | ......................... H01L 28/60 257/E21.256 |
| 8,980,730 | B1* | 3/2015 | Lee | .................... H01L 21/02513 257/44 |
| 2011/0147891 | A1* | 6/2011 | Furukawa | ............ H01G 4/1227 257/E29.345 |
| 2013/0078510 | A1* | 3/2013 | Reynolds | ............... H01G 11/04 29/623.5 |
| 2016/0260544 | A1* | 9/2016 | Adiga | ................. H01L 29/4908 |
| 2018/0053603 | A1* | 2/2018 | Al-Hazmi | .............. H01G 4/206 |
| 2019/0139883 | A1* | 5/2019 | Gandhi | ................... H01L 23/50 |

* cited by examiner

*Primary Examiner* — Duy T Nguyen
(74) *Attorney, Agent, or Firm* — Schwabe, Williamson & Wyatt, P.C.

(57) ABSTRACT

Embodiments herein relate to a capacitor device or a manufacturing process flow for creating a capacitor that includes nanoislands within a package. The capacitor a first conductive plate having a first side and a second side opposite the first side and a second conductive plate having a first side and a second side opposite the first side where the first side of the first conductive plate faces the first side of the second conductive plate. A first plurality of nanoislands is distributed on the first side of the first conductive plate and a second plurality of nanoislands is distributed on the first side of the second conductive plate, where the first conductive plate, the second conductive plate, and the first and second pluralities of nanoislands form a capacitor. The nanoislands may be applied to the conductive plates using a sputtering technique.

14 Claims, 9 Drawing Sheets

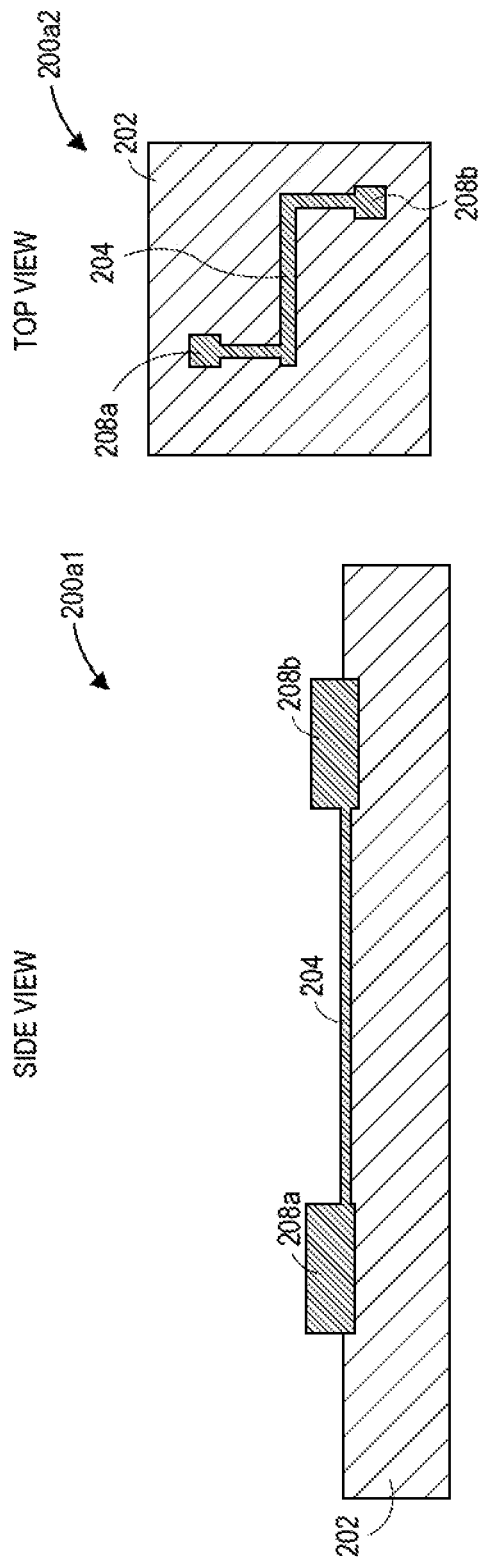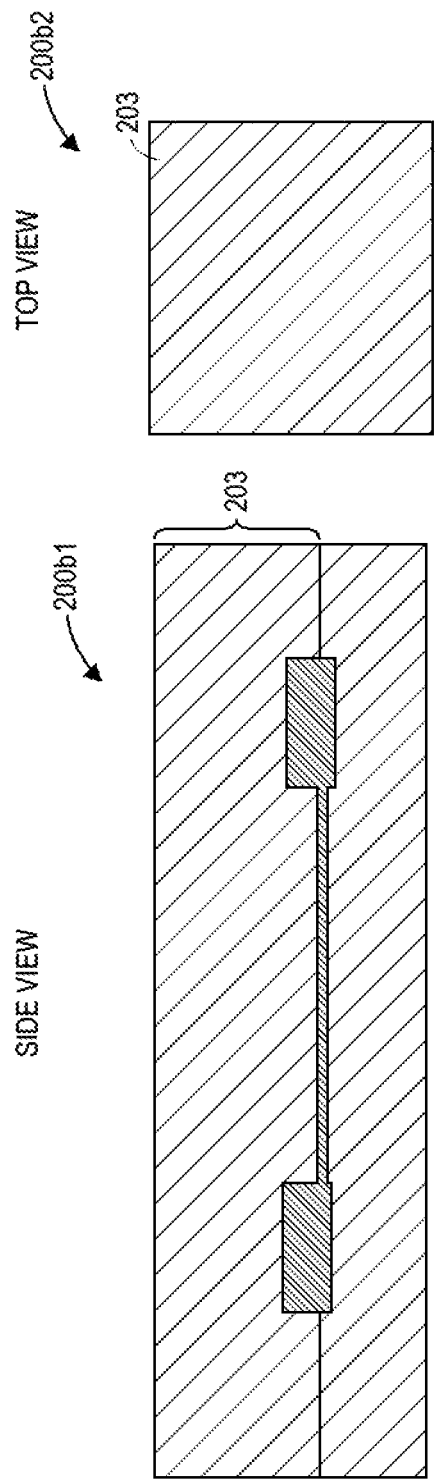
FIG. 2A
FIG. 2B

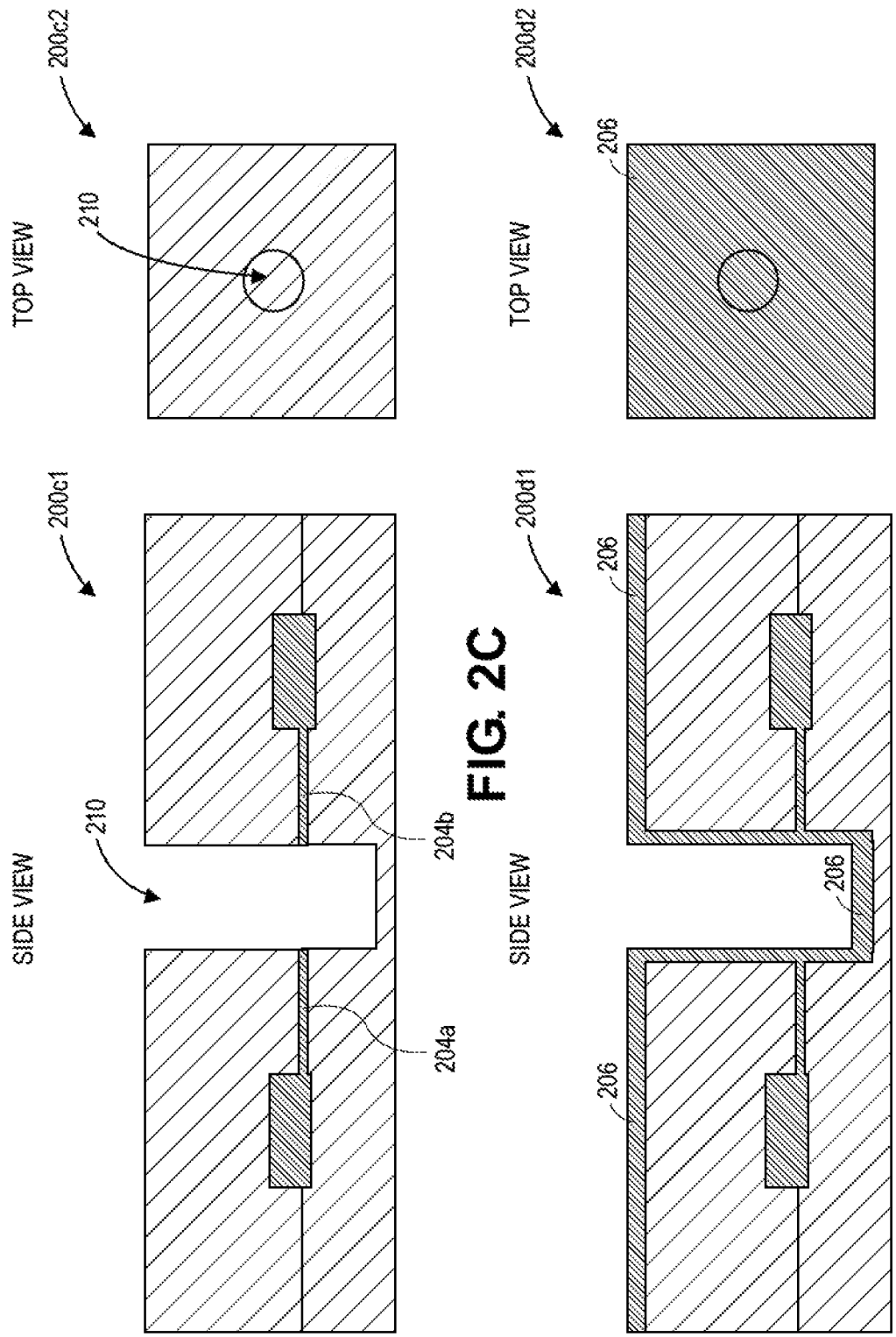

CAPACITORS WITH NANOISLANDS ON CONDUCTIVE PLATES

FIELD

Embodiments of the present disclosure generally relate to the field of package assemblies, and in particular package assemblies that include capacitors.

BACKGROUND

Continued reduction in end product size of mobile electronic devices such as smart phones and ultrabooks is a driving force for the development of reduced size system in package components with increased power requirements.

BRIEF DESCRIPTION OF THE DRAWINGS

FIGS. 2A-2J illustrate an example package assembly that includes a capacitor with nanoislands within the package at various stages of a manufacturing process, in accordance with embodiments.

DETAILED DESCRIPTION

Figure 1:
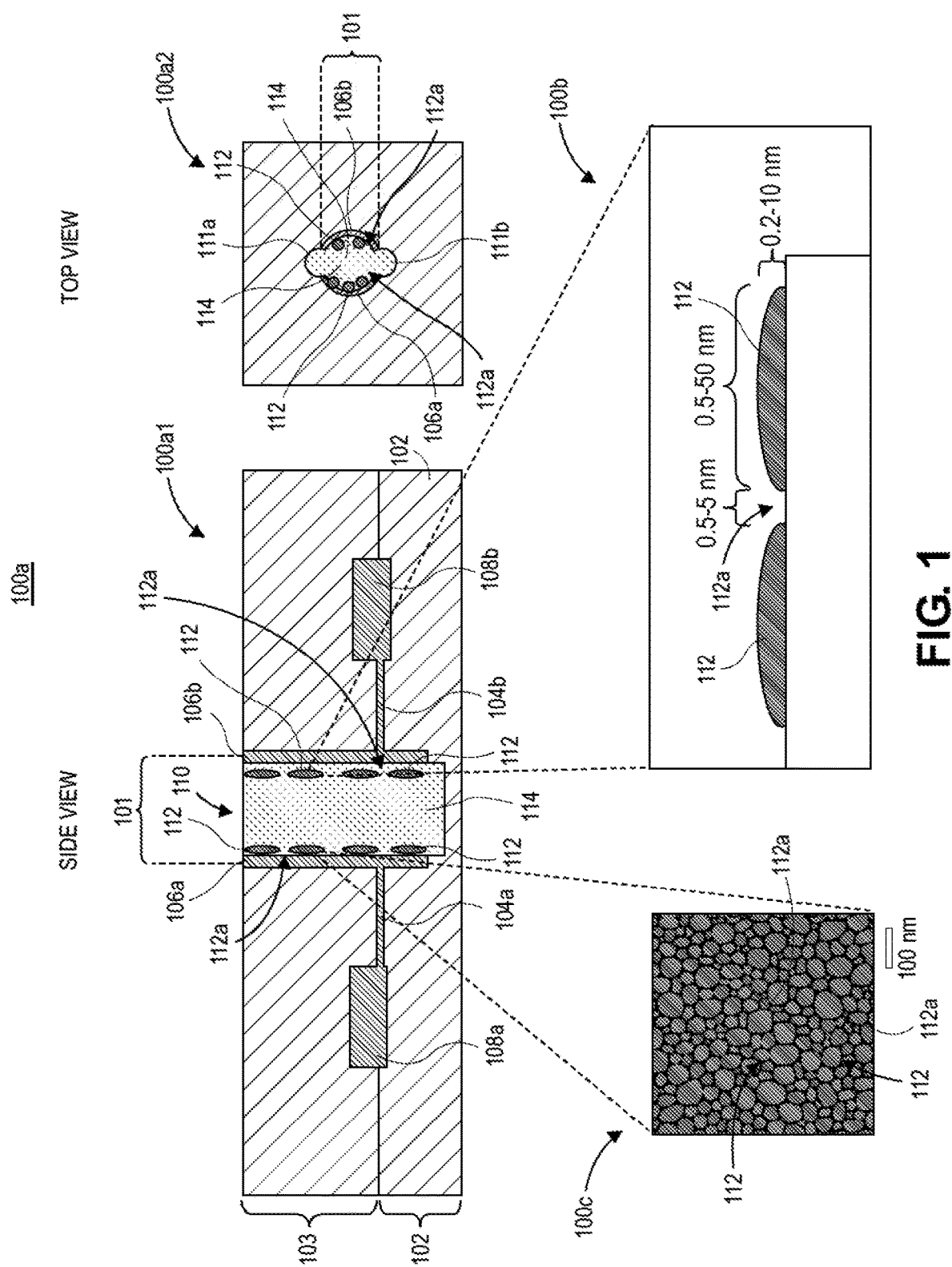
FIG. 1 illustrates an example of various views of a package assembly that includes a capacitor with nanoislands, in accordance with embodiments.

Embodiments of the present disclosure may generally relate to systems, apparatus, and/or processes directed to a capacitor device or a manufacturing process flow for creating a capacitor that includes nanoislands within a package. Embodiments may be directed to a capacitor with a first conductive plate having a first side and a second side opposite the first side. The embodiment may further include a second conductive plate having a first side and a second side opposite the first side where the first side of the first conductive plate faces the first side of the second conductive plate. The embodiment may further include a first plurality of nanoislands distributed on the first side of the first conductive plate and a second plurality of nanoislands distributed on the first side of the second conductive plate where the first conductive plate, the second conductive plate, and the first and second pluralities of nanoislands form a capacitor.

Embodiments may include laminating a layer onto a pre-existing copper trace pattern that is part of a package. During package manufacture, a hole can then be drilled into the package and metallized, which is subsequently sputtered with dielectric nanoislands. The hole can then be plugged with any filler material. Two addition holes can be drilled to break electrical continuity in the cylindrical copper layer. These additional holes separate the cylinder into two electrically isolated plates connected to isolated circuits. When the circuits are biased, the two plates form a cylindrical capacitor and the sputtered nanoislands will create a super capacitor.

In embodiments, the capacitors that include nanoislands on the surface of its respective capacitive plates may be referred to as super capacitors, or cylindrical super capacitors that use dielectric nanoislands. In embodiments, the small gaps between the dielectric nanoislands forms a supercapacitive junction that provides greater power delivery and performance at a lower manufacturing cost.

Passive devices, such as resistors, inductors, and capacitors, are critical devices in semiconductor packaging used for the modulation, conversion, and storage of electrical signals. As design rules continue to shrink in semiconductor packaging, so does the availability of space for discrete passives within packages. Legacy projections indicate that passive density will surpass 20-30 passives per square centimeter by the end of 2019.

In embodiments, capacitors for power delivery may be built using the techniques described herein within a substrate core using cylindrical capacitors to utilize room within the core. In embodiments, this may be accomplished by drilling through a trace on the substrate, and using each resulting lead as an input to a side of the capacitor. A mechanical or a laser drill may be used to drill the hole. Dielectric islands, which may range from 1 to 25 nm and be irregularly shaped, are placed on the surface of the cylindrical capacitors using sputtering, or high-pressure sputtering and evaporation. At lower film thicknesses, discontinuous dielectric nanoislands may form on the surface of the cylinder, where each island should have a similar morphology and yet be of a random shape. The small gaps between these discontinuous dielectric nanoislands cause an antenna effect that sends permittivity very high, thus creating a super capacitive structure by forming super junctions. These discontinuous dielectric nanoislands may also be referred to as super islands. This technique may be used during manufacture at volume.

Embodiments may be used when fabricating passives in parallel with legacy build-up processes to increase passive density in packages that may reduce overall electrical loss and increase package functionality and power delivery.

Legacy implementations for implementing nanoparticles involve using a Langmuir Blodgett film and making nanoparticles in a colloidal solution and depositing them without using evaporation techniques. This has the disadvantage of being difficult to manufacture at high scale.

Legacy methods of adding passives to packages center on the fabrication of discrete passive devices which are then either mounted onto the first level interconnect (FLI) of the package or implanted into layers during build-up. Legacy implementations rely mainly on the addition of pre-assembled capacitors onto the surface of semiconductor packages. Legacy implementations also exist to embed pre-assembled capacitors into build-up layers on the package, but are limited in terms of passive density and are costly. These legacy implementations are limited in the density of passive components that can be added to a semiconductor package. In addition, legacy techniques are mostly limited to making passives on surface layers, and increasing performance requirements for capacitors adds to the cost of pre-assembling these passives prior to addition to the package.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates an example of various views of a package assembly that includes a capacitor with nanoislands, in accordance with embodiments. Diagram 100*a* shows a side view 100*a*1 and a top view 100*a*2 of a capacitor 101 with nanoislands 112 embedded in a package. The nanoislands 112 are made of a dielectric material that may have a high-k value. Diagram 100*a*1 shows a first package layer 102 that includes a first trace 104*a* that is electrically coupled to a first capacitor plate 106*a*, and a second trace 104*b* that is electrically coupled to a second capacitor plate 106*b*.

A second package layer 103 may be placed on top of the first layer 102 and the traces 104*a*, 104*b*. In embodiments, the package assembly 100*a*1 may include any number of layers that may or may not include redistribution layer (RDL) circuitry. As shown, the traces 104*a*, 104*b* are not directly electrically coupled. In embodiments, the traces 104*a*, 104*b* may be portions of a RDL trace applied to a top surface of the first layer 102. In embodiments, the traces 104*a*, 104*b* may be coupled to pads 108*a*, 108*b*, respectively. These traces serve to provide a bias for the capacitor. In embodiments, the traces 104*a*, 104*b* may have originally been a single trace that was severed when a cavity 110 was made into the package 100*a*1. In embodiments, the cavity 110 may be made by drilling. In embodiments, the traces 104*a*, 104*b*, the pads 108*a*, 108*b*, and the capacitor plates 106*a*, 106*b* may be copper (Cu), a Cu alloy, or other material that conducts electrical current within a package.

As shown, surfaces of the first conductive plate 106*a* and the second conductive plate 106*b* are coated with nanoislands 112. In embodiments, the material composition of the nanoislands 112 may be a high-k dielectric such as barium titanate, strontium titanate, silicon nitride, silicon carbide, tantalum nitride, titanium nitride, silicon nitride, titanium oxide, lithium nitride, hafnium oxide, and lanthanum boride. The nanoislands 112 may be applied using a sputtering or evaporation technique using plasma-enhanced chemical vapor deposition (PCVD). In embodiments, high-pressure sputtering may be used with evaporating a very fine film. The resulting nanoislands 112 form electric islands that may be between 1 to 25 nm and may be irregularly shaped and are separated by gaps 112*a*, as shown in diagram 100*c*. In embodiments, if a sputtering film with a thickness less than approximately 15 nm is used, the nanoislands 112 structures will result. In other examples, if a film with a thickness greater than approximately 15 nm is used, the resulting splattered material may tend to coalesce and form a thin film rather than consistently forming nanoislands 112.

In embodiments, each of the nanoislands 112 may have a similar morphology, and be randomly shaped islands with irregular gaps 112*a* between the islands. As shown in diagram 100*b*, in embodiments the nanoislands 112 may have a width that may range from 0.5 to 50 nm, and a height that may range from 0.2 to 10 nm. In embodiments, the gaps 112*a* between the nanoislands 112 may range from 0.5 nm to 5 nm. Due to the formation of these nanoislands 112, and the small gaps 112*a* between them, an antenna effect is created that may raise permittivity extremely high and results in a super capacitive structure by forming super junctions. The gaps in between the nanoislands serve as the nanojunctions.

After the nanoislands 112 are placed on the first conductive plate 106*a* and the second conductive plate 106*b*, the hole 110, or cavity between the first conductive plate 106*a* and the second conductive plate 106*b*, may be filled with a plug material 114. The plug material 114 may include a high-k dielectric. The result is a super capacitor 101 built within the package 100*a*.

As shown in the top down view 100*a*2, the capacitor 101 includes the conductive plates 106*a*, 106*b*, that are electrically isolated from each other by drilled holes 111*a*, 111*b*. The drilled holes 111*a*, 111*b* may then be filled with plug material 114.

Figure 2E:
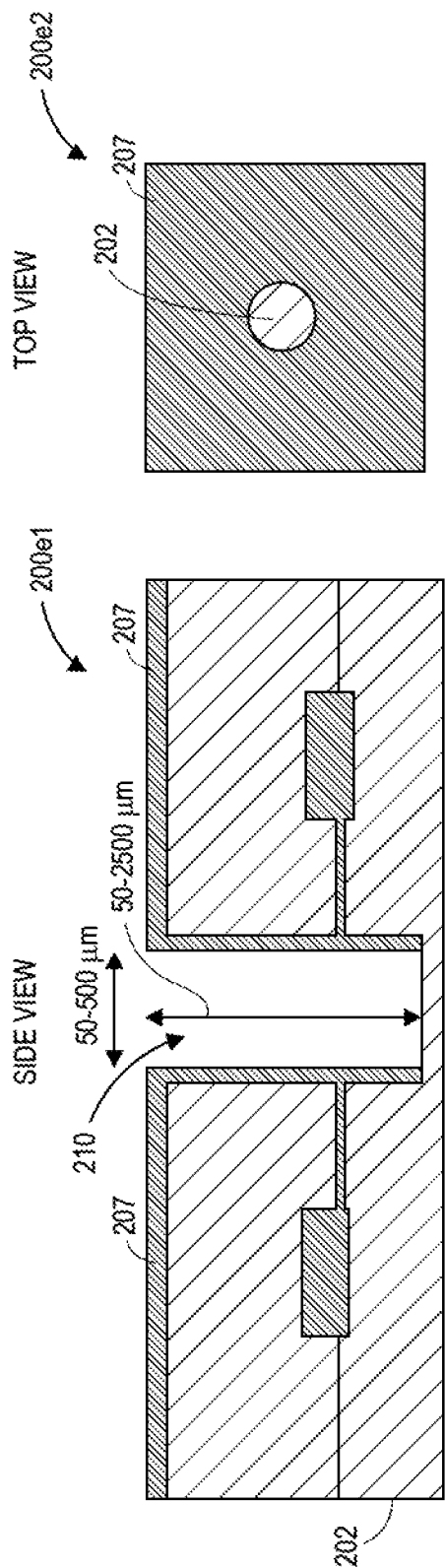

FIGS. 2A-2J illustrate an example package assembly that includes a capacitor with nanoislands within the package at various stages of a manufacturing process, in accordance with embodiments. FIG. 2A includes diagram 200*a*1 that shows a side view of a partial package into which a capacitor is to be inserted. Traces 204, which may be similar to traces 104*a*, 104*b* of FIG. 1, may be placed on a layer 202, which may be similar to layer 102 of FIG. 1. Traces 204 may be coupled with pads 208*a*, 208*b*, which may be similar to pads 108*a*, 108*b* of FIG. 1. As shown in top-down diagram 200*a*2, the traces 204 and the pads 208*a*, 208*b*, may be manufactured as an RDL on the top of the layer 202. In embodiments, the traces 204 and pads 208*a*, 208*b* may be taken from a pre-existing pattern used for manufacturing the capacitor within the package.

FIG. 2B includes diagrams 200*b*1 and 200*b*2 that shows a side view and a top view of the package, onto which a second layer 203 is applied. In embodiments, an Ajinomoto Build-up Film (ABF) may be laminated on first layer 202 that includes the traces 204 and the pads 208*a*, 208*b*. In embodiments, the techniques of FIG. 2A and FIG. 2B may be repeated multiple times to create multiple layers within the package.

FIG. 2C includes diagrams 200*c*1 and 200*c*2 that show a side view and a top view of the package. A hole 210 is drilled through layers 202 and 203 that extends through and beyond the trace 204, and severs trace 204 into two separate traces 204*a*, 204*b*. In embodiments, the hole 210 may be created by laser drilling or mechanical drilling techniques, or other techniques used to create through holes in package layers. In embodiments, the hole 210, as shown in diagram 200*c*2, may be round, or alternatively may be oblong, square or some other shape depending upon the drilling technique. In embodiments, the hole 210 may be created using through hole techniques.

FIG. 2D includes diagrams 200*d*1 and 200*d*2 that show a side view and the top view of the package. A metallization layer 206 is applied to the surface of the package. In embodiments, this metallization layer 206 may include Cu, be electrically coupled with the traces 204*a*, 204*b*, and form capacitor plates as described further below.

FIG. 2E includes diagrams 200*e*1 and 200*e*2 that show a side view and the top view of the package. A portion of the metallization layer 206 is removed at the bottom of the hole 210 leaving metallization layer 207. This technique is to expose a portion of the first layer 202 at the bottom of hole 210. In embodiments, the width of the hole 210 including the metallization layer 207 may range between 50 and 500 µm, and the depth of the hole 210 may range between 50 and 2500 µm.

Figure 2F:
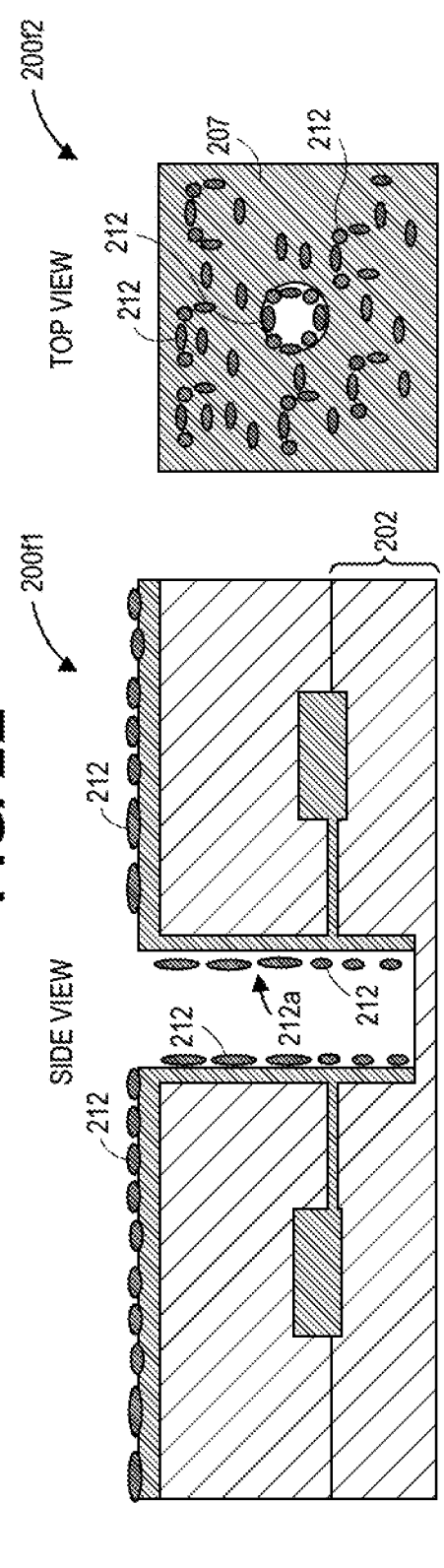

FIG. 2F includes diagrams 200*f*1 and 200*f*2 that show a side view and the top view of the package. Nanoislands 212 may be placed on the surface of the metallization layer 207 by using a sputtering technique to apply high-k dielectric material that may be in film form. The nanoislands 212, may range from 1 to 25 nanometers in width and be irregularly shaped. The nanoislands 212 may be formed and applied using sputtering, or high-pressure sputtering, and evaporation. At lower film thicknesses, discontinuous nanoislands 212 will form on the surface of the cylinder, separated by small gaps 212*a*. Each nanoisland 212 may have a similar morphology and yet be of a random shape. During capacitor operation, the small gaps 212*a* between these nanoislands 212 will cause an antenna effect that sends permittivity very high to create a super capacitive structure by forming super junctions.

Figure 2G:
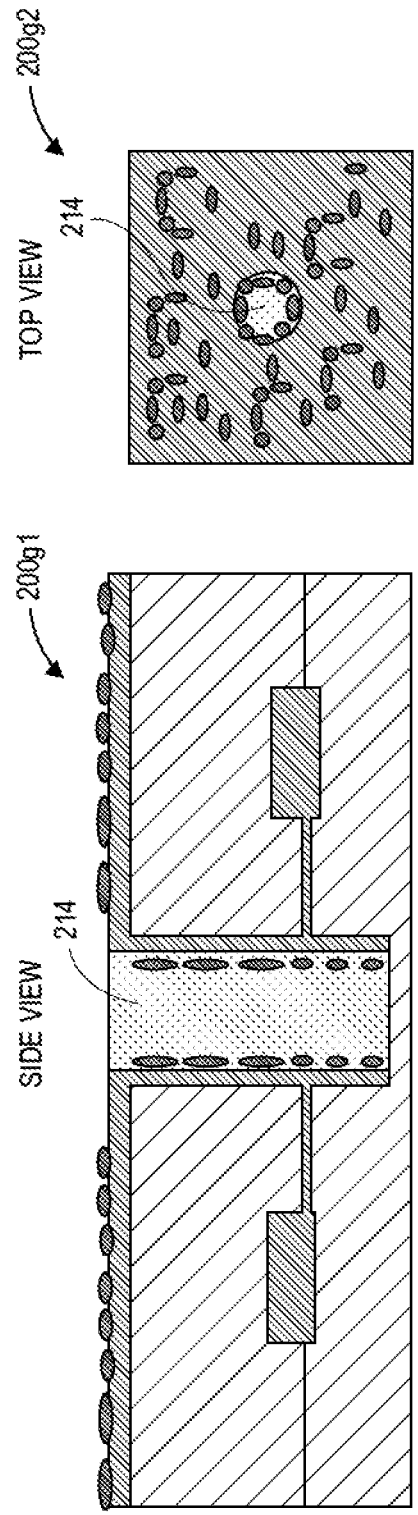

FIG. 2G includes diagrams 200*g*1 and 200*g*2 that show a side view and the top view of the package. The hole 210 is filled with a high-k plug material 214, or other suitable dielectric material.

Figure 2H:
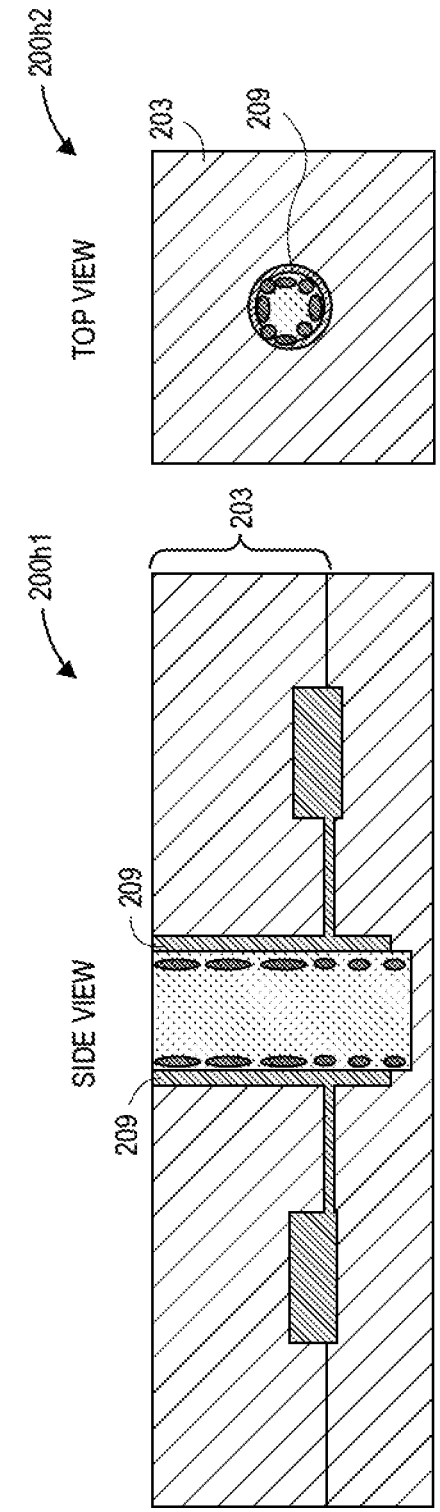

FIG. 2H includes diagrams 200*h*1 and 200*h*2 that show a side view and the top view of the package. The metallization layer 207 on top of the package is removed, along with any of the nanoislands 212 that may have been attached to the top of the package. In embodiments, this process may be accomplished by a flash etching. The resulting metallization layer 209 is left that will form the two capacitors plates as described further below.

Figure 2I:
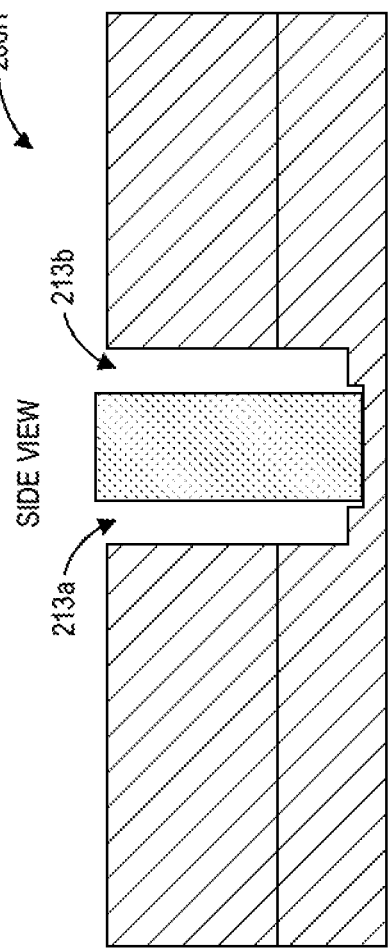

FIG. 2I includes diagrams 200*i*1 and 200*i*2 that show a side view and the top view of the package. Note: the side view is rotated 90° from FIG. 2H. Two holes 213*a*, 213*b* are drilled into the package and through the metallization layer 209, separating the metallization layer 209 into two capacitor plates 206*a*, 206*b*. In embodiments, the metallization layer 209 forms an annulus of copper around the high-k plug 214. The holes 213*a*, 213*b* are drilled in such a way to separate the annulus into two halves, the capacitor plates 206*a*, 206*b*, that are not directly electrically coupled. During capacitor operation, one plate will have a negative bias and the other a positive bias.

Figure 2J:
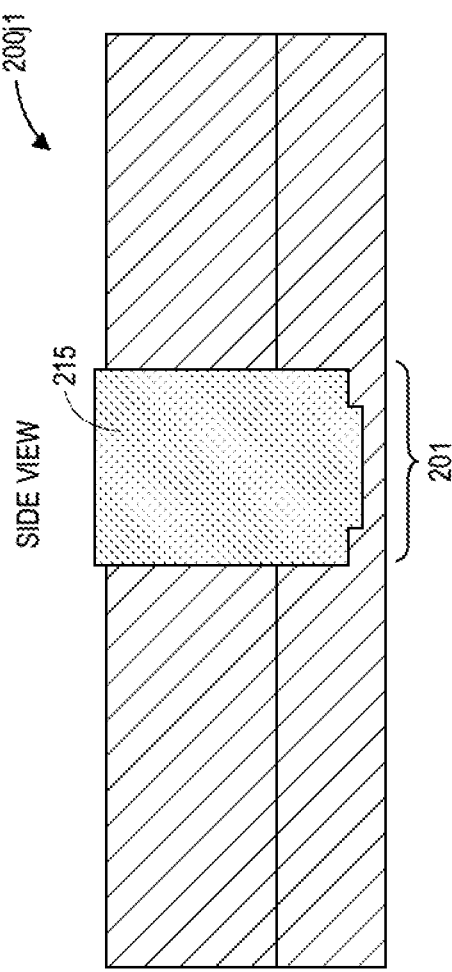

FIG. 2J includes diagrams 200*j*1 and 200*j*2 that show a side view and the top view of the package. Note: the side view is rotated 90° from FIG. 2H. The holes 213*a*, 213*b* are filled with more high-k material 215. The result is a vertical capacitor 201, with capacitor plates 206*a*, 206*b* that have nanoislands 212 on the surface to create a super capacitor.

Figure 3:
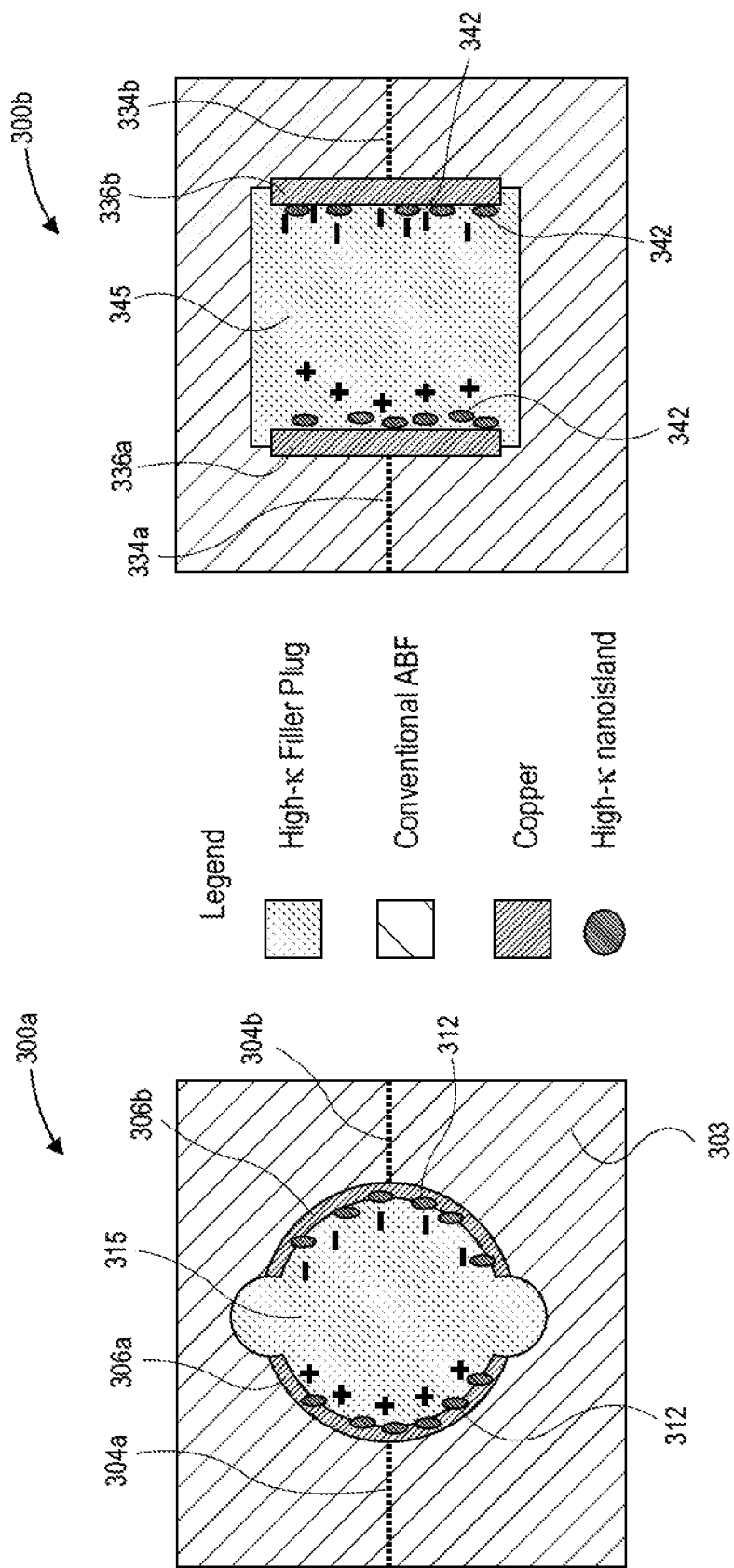
FIG. 3 illustrates various top-down views of a capacitor with nanoislands within a package assembly, in accordance with embodiments.

FIG. 3 illustrates various top-down views of a capacitor with nanoislands within a package assembly, in accordance with embodiments. Diagram 300*a* shows an example cross-section of a super capacitor formed using one or more of the techniques described above that include a circular drill. The super capacitor may be formed within layers 303, which may be ABF, and which may be similar to layer 103 of FIG. 1. A first trace 304*a*, which may be similar to trace 104*a* of FIG. 1, electrically couples with a first capacitor plate 306*a*, which may be similar to first capacitor plate 106*a* of FIG. 1, that includes a plurality of nanoislands 312, which may include high-k material and which may be similar to nanoislands 112 of FIG. 1. A second trace 304*b*, which may be similar to trace 104*b* of FIG. 1, electrically couples with a second capacitor plate 306*b*, which may be similar to second capacitor plate 106*b* of FIG. 1, that includes a plurality of nanoislands 312 placed using techniques described herein. The first capacitor plate 306*a* and the second capacitor plate 306*b* are not directly electrically coupled. A plug material 315, which may be similar to plug material 114 of FIG. 1, which may be a high-k filler plug material or other dielectric, fills and separates the capacitor plates 306*a*, 306*b*. During operation, the positive charge may accumulate on the first capacitor plate 306*a*, and the negative charge may accumulate on the second capacitor plate 306*b*.

Diagram 300*b* shows an example cross-section of the super capacitor formed using one or more of the techniques described above that include a square drill. A first trace 334*a*, which may be similar to trace 304*a*, electrically couples with a first capacitor plate 336*a*, which may be similar to first capacitor plate 306*a*, that includes a plurality of nanoislands 342, which may include high-k material and which may be similar to nanoislands 312. A second trace 334*b*, which may be similar to trace 304*b*, electrically couples with a second capacitor plate 336*b*, which may be similar to second capacitor plate 306*b*, that includes a plurality of nanoislands 312 placed using techniques described herein. The first capacitor plate 306*a* and the second capacitor plate 306*b* are not directly electrically coupled. A plug material 345, which may be similar to plug material 315, which may be a high-k filler plug material or other dielectric, fills and separates the capacitor plates 336*a*, 336*b*. During operation, the positive charge may accumulate on the first capacitor plate 336*a*, and the negative charge may accumulate on the second capacitor plate 336*b*.

Figure 4:
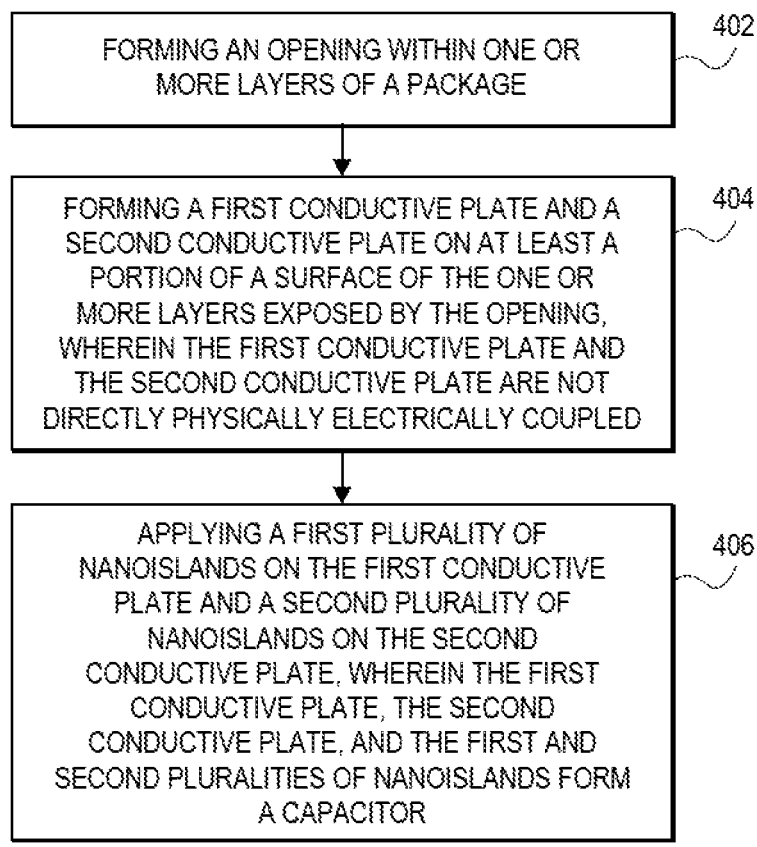
FIG. 4 illustrates an example process to create a capacitor with nanoislands within a package, in accordance with embodiments.

FIG. 4 illustrates an example process to create a capacitor with nanoislands within a package, in accordance with embodiments. Process 400 may be performed by one or more elements, techniques, processes, or systems that may be found in FIGS. 1-3.

At block 402, the process may include forming an opening within one or more layers of a package. In embodiments, the one or more layers of the package may correspond to layers 102, 103 of FIG. 1, including any pads 108*a*, 108*b* or traces 204 of FIG. 2A that may be placed on the one or more layers. In embodiments, the opening may correspond to cavity 110 of FIG. 1 or hole 210 of FIG. 2. The opening may be formed using a drill, such as a laser drill or mechanical drill. In addition, the opening may be formed in a variety of shapes, for example a circular opening using a round drill, a square opening using a square drill, or some other opening shape such as an oval or irregular shape. For example, the opening may have one side when shape (e.g. flat), and a side opposite another shape (e.g. curved).

In addition, the opening may be substantially perpendicular to the one or more layers of the package, or may be at an angle, or at a bias, to a plane of the one or more layers of the package. In embodiments, this may provide a higher density of capacitors within the package.

At block 404, the process may include forming a first conductive plate and a second conductive plate on at least a portion of a surface of the one or more layers exposed by the opening, wherein the first conductive plate and the second conductive plate are not directly physically electrically coupled. In embodiments, the first conductive plate and the second conductive plate may correspond to capacitor plates 106a, 106b respectively of FIG. 1, capacitor plates 206a, 206b of FIG. 2J, or capacitor plates 306a, 306b and 336a, 336b of FIG. 3.

At block 406, the process may include applying a first plurality of nanoislands on the first conductive plate and a second plurality of nanoislands on the second conductive plate, wherein the first conductive plate, the second conductive plate, and the first and second pluralities of nanoislands form a capacitor. In embodiments, the first plurality or the second plurality of nanoislands may correspond to nanoislands 112 of FIG. 1, nanoislands 212 of FIGS. 2F-2J, and nanoislands 312 and 342 of FIG. 3. In embodiments, the nanoislands may be applied on the surface of the conductive plates using sputtering, or high-pressure sputtering, and evaporating. In embodiments, the nanoislands may range in size from 1 to 25 nm and be irregularly shaped. In embodiments, the nanoislands will be wider than they are thicker. Spacing between the nanoislands using this technique may be irregular, but provided the spacing is below a few nanometers then the nanoislands will cause a super capacitive effect. The sputtering and evaporation technique makes the small particles with the small junctions between them that gives super capacitive characteristics.

Figure 5:
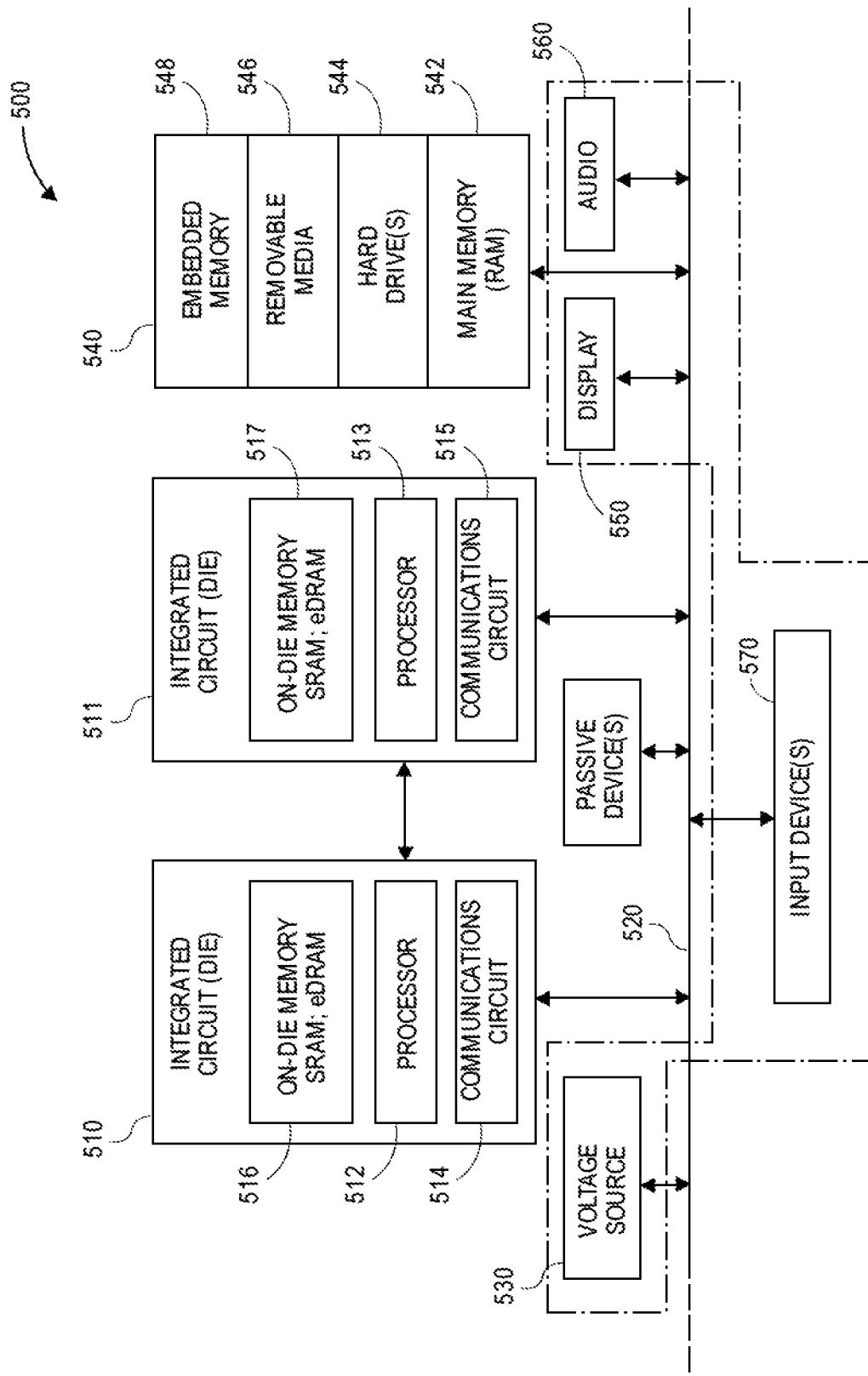
FIG. 5 schematically illustrates a computing device, in accordance with embodiments.

FIG. 5 schematically illustrates a computing device, in accordance with embodiments.

FIG. 5 is a schematic of a computer system 500, in accordance with an embodiment of the present invention. The computer system 500 (also referred to as the electronic system 500) as depicted can embody capacitors with nanoislands on conductive plates, according to any of the several disclosed embodiments and their equivalents as set forth in this disclosure. The computer system 500 may be a mobile device such as a netbook computer. The computer system 500 may be a mobile device such as a wireless smart phone. The computer system 500 may be a desktop computer. The computer system 500 may be a hand-held reader. The computer system 500 may be a server system. The computer system 500 may be a supercomputer or high-performance computing system.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, capacitors with nanoislands on conductive plates, as disclosed herein. In an embodiment, SRAM embodiments are found in memory caches of the processor 512. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 511 includes embedded on-die memory 517 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550, an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate having capacitors with nanoislands on conductive plates, according to any of the several disclosed embodiments and their equivalents, an electronic system, a computer system, one or more methods of fabricating an integrated circuit, and one or more methods of fabricating an electronic assembly that includes a package substrate having capacitors with nanoislands on conductive plates, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having capacitors with nanoislands on conductive plates embodiments and their equivalents. A foundation substrate may be included, as represented by the dashed line of FIG. 5. Passive devices may also be included, as is also depicted in FIG. 5.

EXAMPLES

The following paragraphs describe examples of various embodiments.

Example 1 is a device comprising: a first conductive plate having a first side and a second side opposite the first side; a second conductive plate having a first side and a second side opposite the first side, wherein the first side of the first conductive plate faces the first side of the second conductive plate; and a first plurality of nanoislands distributed on the first side of the first conductive plate and a second plurality of nanoislands distributed on the first side of the second conductive plate, wherein the first conductive plate, the second conductive plate, and the first and second pluralities of nanoislands form a capacitor.

Example 2 includes the device of claim 1, wherein the nanoislands include a dielectric material.

Example 3 includes the device of example 1, further comprising gaps between each of the first plurality and the second plurality of nanoislands, wherein the gaps form super-capacitive junctions.

Example 4 includes the device of example 3, wherein the gaps between the nanoislands are between 0.5 and 5.0 nm.

Example 5 includes the device of example 1, wherein the first plurality or the second plurality of nanoislands include a selected one of silicon nitride (SiN), hafnium oxide ($HfO_2$), or titanium nitride (TiN).

Example 6 includes the device of example 1, wherein the first conductive plate and the second conductive plate include copper (Cu).

Example 7 includes the device of example 1, wherein the first conductive plate or the second conductive plate are a selected one of concave or substantially planar.

Example 8 includes the device of any one of examples 1-7, further comprising a dielectric material that substantially fills a volume between the first conductive plate and the second conductive plate.

Example 9 includes the device of any one of examples 1-8, further comprising an edge surface of the first conductive plate substantially perpendicular to a portion of the first side or to a portion of the second side of the first conductive plate, wherein the edge surface is concave.

Example 10 includes the device of any one of examples 1-8, wherein the nanoislands are a sputtered film.

Example 11 includes the device of any one of examples 1-8, wherein the first conductive plate or the second conductive plate are electrically coupled with a first and a second trace pattern in a layer of a package.

Example 12 is a method comprising: forming an opening within one or more layers of a package; forming a first conductive plate and a second conductive plate on at least a portion of a surface of the one or more layers exposed by the opening, wherein the first conductive plate and the second conductive plate are not directly physically electrically coupled; and applying a first plurality of nanoislands on the first conductive plate and a second plurality of nanoislands on the second conductive plate, wherein the first conductive plate, the second conductive plate, and the first and second pluralities of nanoislands form a capacitor.

Example 13 includes the method of claim 12, wherein forming an opening within one or more layers of the package further includes drilling a hole through the one or more layers of the package.

Example 14 includes the method of example 13, wherein drilling a hole through the one or more layers of the package further includes drilling a hole through a conductive trace within the one or more layers of the package.

Example 15 includes the method of any one of examples 12-14, wherein forming a first conductive plate and a second conductive plate further include: applying a conductive layer to the at least a portion of the surface of the one or more layers exposed by the opening; removing a first portion of the conductive layer to expose a first portion of the one or more layers of the package; removing a second portion of the conductive layer to expose a second portion of the one or more layers of the package; and wherein the first conductive plate and the second conductive plate are separated by the first portion and the second portion of the one or more layers of the package.

Example 16 includes the method of example 15, wherein applying the conductive layer to the at least a portion of the surface of the one or more layers exposed by the opening further includes performing metallization of the at least a portion of the surface of the one or more layers with copper (Cu).

Example 17 includes the method of example 15, wherein removing a first portion of the conductive layer to expose a first portion of the one or more layers of the package further includes drilling a hole through a side of the conductive layer, wherein the hole is substantially parallel to a side of the conductive layer.

Example 18 includes the method of any one of examples 12-17, wherein applying a first plurality of nanoislands on the first conductive plate further includes sputtering nanoislands onto at least the first conductive plate.

Example 19 includes the method of example 18, wherein the nanoislands include a high-k material.

Example 20 includes the method of example 12, further comprising filling a volume between the first conductive plate and the second conductive plate with a dielectric material.

Example 21 is a package comprising: one or more layers; a capacitor extending through at least a portion of the one or more layers, the capacitor including: a first conductive plate having a first side and a second side opposite the first side; a second conductive plate having a first side and a second side opposite the first side, wherein the first side of the first conductive plate faces the first side of the second conductive plate; a first plurality of nanoislands distributed on the first side of the first conductive plate and a second plurality of nanoislands distributed on the first side of the second conductive plate; and a first and a second conductive trace on one of the one or more layers, wherein the first conductive trace is electrically coupled with the first conductive plate and the second conductive trace is electrically coupled with the second conductive plate.

Example 22 includes the package of example 21, wherein the nanoislands are a high-k dielectric, and further comprising gaps between each of the first plurality and the second plurality of nanoislands, wherein the gaps form super-capacitive junctions.

Example 23 includes the package of example 22, wherein the gaps between the nanoislands are between 0.5 and 5.0 nm.

Example 24 includes the package of any one of examples 21-23, wherein the first conductive plate or the second conductive plate are concave.

Example 25 package of any one of examples 21-24, wherein the nanoislands are a sputtered film.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A device comprising:
   a first conductive plate having a first side and a second side opposite the first side;
   a second conductive plate having a first side and a second side opposite the first side, wherein the first side of the first conductive plate faces the first side of the second conductive plate;
   a first plurality of discontinuous regions of dielectric material distributed on and in direct contact with the first side of the first conductive plate and a second plurality of discontinuous regions of dielectric material distributed on and in direct contact with the first side of the second conductive plate, wherein the first conductive plate, the second conductive plate, and the first and second pluralities of discontinuous regions of dielectric material form a capacitor; and
   a dielectric material that substantially fills a volume between the first conductive plate and the second conductive plate, wherein the dielectric material separates the first plurality of discontinuous regions of dielectric material from the second plurality of discontinuous regions of dielectric material, and wherein one of the first plurality of discontinuous regions of dielectric material overlaps with one of the second plurality of discontinuous regions of dielectric material along a direction from the first conductive plate to the second conductive plate, the direction orthogonal to the first side of the first conductive plate and to the first side of the second conductive plate.

2. The device of claim 1, further comprising gaps between each of the first plurality and the second plurality of discontinuous regions of dielectric material, wherein the gaps form super-capacitive junctions.

3. The device of claim 2, wherein the gaps between the discontinuous regions of dielectric material are between 0.5 and 5.0 nm.

4. The device of claim 1, wherein the first plurality of discontinuous regions of dielectric material or the second plurality of discontinuous regions of dielectric material include a selected one of silicon nitride (SiN), hafnium oxide ($HfO_2$), or titanium nitride (TiN).

5. The device of claim 1, wherein the first conductive plate and the second conductive plate include copper (Cu).

6. The device of claim 1, wherein the first conductive plate or the second conductive plate is a selected one of concave or substantially planar.

7. The device of claim 1, further comprising an edge surface of the first conductive plate substantially perpendicular to a portion of the first side or to a portion of the second side of the first conductive plate, wherein the edge surface is concave.

8. The device of claim 1, wherein the discontinuous regions of dielectric material are a sputtered film.

9. The device of claim 1, wherein the first conductive plate and the second conductive plate are electrically coupled with a first trace pattern and a second trace pattern in a layer of a package.

10. A package comprising:
    one or more layers;
    a capacitor extending through at least a portion of the one or more layers, the capacitor including:
      a first conductive plate having a first side and a second side opposite the first side;
      a second conductive plate having a first side and a second side opposite the first side, wherein the first side of the first conductive plate faces the first side of the second conductive plate;
      a first plurality of discontinuous regions of dielectric material distributed on and in direct contact with the first side of the first conductive plate and a second plurality of discontinuous regions of dielectric material distributed on and in direct contact with the first side of the second conductive plate; and
      a dielectric material that substantially fills a volume between the first conductive plate and the second conductive plate, wherein the dielectric material separates the first plurality of discontinuous regions of dielectric material from the second plurality of discontinuous regions of dielectric material, and wherein one of the first plurality of discontinuous regions of dielectric material overlaps with one of the second plurality of discontinuous regions of dielectric material along a direction from the first conductive plate to the second conductive plate, the direction orthogonal to the first side of the first conductive plate and to the first side of the second conductive plate; and
    a first conductive trace and a second conductive trace on one of the one or more layers, wherein the first conductive trace is electrically coupled with the first conductive plate and the second conductive trace is electrically coupled with the second conductive plate.

11. The package of claim 10, wherein the discontinuous regions of dielectric material are a high-k dielectric, and further comprising gaps between each of the first plurality and the second plurality of discontinuous regions of dielectric material, wherein the gaps form super-capacitive junctions.

12. The package of claim 11, wherein the gaps between the discontinuous regions of dielectric material are between 0.5 and 5.0 nm.

13. The package of claim 10, wherein the first conductive plate or the second conductive plate is concave.

14. The package of claim 10, wherein the discontinuous regions of dielectric material are a sputtered film.

* * * * *